United States Patent [19]

Shindo et al.

[11] Patent Number: 6,036,741
[45] Date of Patent: *Mar. 14, 2000

[54] PROCESS FOR PRODUCING HIGH-PURITY RUTHENIUM

[75] Inventors: Yuichiro Shindo; Tsuneo Suzuki, both of Toda, Japan

[73] Assignee: Japan Energy Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/116,616

[22] Filed: Jul. 16, 1998

[30] Foreign Application Priority Data

Jul. 31, 1997 [JP] Japan ................................ 9-219014

[51] Int. Cl.[7] .............................. C21B 11/10; B22F 1/00; C22F 1/14

[52] U.S. Cl. ............................ 75/10.28; 75/361; 75/367; 148/678

[58] Field of Search .............................. 420/462; 75/247, 75/369, 410, 631, 345, 10.1, 10.28, 361, 367; 423/22; 428/433, 450, 689; 148/678

[56] References Cited

FOREIGN PATENT DOCUMENTS

| 0248396 | 12/1987 | European Pat. Off. . |
| 408199350 | 8/1996 | Japan . |
| 408302462A | 11/1996 | Japan . |
| 408311641A | 11/1996 | Japan . |
| 409041131A | 2/1997 | Japan . |

*Primary Examiner*—Timothy Speer
*Assistant Examiner*—Stephen Stem
*Attorney, Agent, or Firm*—Akin, Gump Strauss, Hauer & Feld, L.L.P.

[57] ABSTRACT

A process comprises forming ruthenium tetroxide by blowing ozone-containing gas into crude ruthenium powder while hypochlorous acid is being added to the powder, allowing a hydrochloric acid solution to absorb the ruthenium tetroxide, evaporating the solution to dryness, and roasting the $RuOCl_3$ crystals thus obtained in a hydrogen atmosphere. Thus a high-purity ruthenium material for thin film deposition, typically sputtering targey, is obtained which contains less than 1 ppm each of alkali metal elements, less than 1 ppm each of alkaline earth metal elements, less than 1 ppm each of transition metal elements, less than 10 ppb each of radioactive elements, a total of less than 500 ppm of carbon and gaseous ingredient elements, the material having a purity of ruthenium of at least 99.995% excluding the gaseous ingredient elements.

12 Claims, No Drawings

6,036,741

PROCESS FOR PRODUCING HIGH-PURITY RUTHENIUM

[BACKGROUND OF THE INVENTION]

This invention relates to a process for producing high-purity ruthenium useful as a material for the lower electrode of ferroelectric capacitors for MOS-ULSI, and relates also to high-purity ruthenium sputtering targets.

In recent years, research has been made in the manufacture of semiconductor memories about the use of thin films of such ferroelectrics as Ba—Ti, Sr—Ti, and Ba—Sr—Ti complex oxides as capacitors on wafers of silicon or the like as semiconductor elements. Study is also under way on the formation of a ruthenium oxide film by the sputtering of a ruthenium target material in an oxygen atmosphere as a lower electrode material for those thin film ferroelectric capacitors.

In order to ensure that such a semiconductor member formed by sputtering should perform reliably, it is important to minimize the proportion of the metal and other impurities in the material that are deleterious to the semiconductor device.

The impurities that must be removed to minimum contents include:

(1) alkali metal elements such as Na and K;
(2) radioactive elements such as U and Th; and
(3) heavy metal elements such as Fe and Ni.

Alkali metal elements such as Na and K migrate easily in a dielectric film and can cause deterioration of MOS-ULSI interface characteristics. Radioactive elements such as U and Th emit alpha rays that are often responsible for soft errors of the device. Heavy metal elements such as Fe and Ni too can cause troubles of interface connections.

In general, industrial production of ruthenium is typified by the following process:

Crude ruthenium is oxidized and dissolved by the addition of caustic potash (KOH) and potassium nitrate so that ruthenium is converted to soluble potassium ruthenate. This salt is extracted with water, and chlorine gas is injected, followed by heating to form ruthenium tetroxide. It is then collected in dilute hydrochloric acid that contains methyl alcohol. The resulting solution is evaporated to dryness and then roasted in an oxygen atmosphere to ruthenium dioxide. Further, ignition of the ruthenium dioxide in hydrogen yields metallic ruthenium.

However, the ruthenium powder made this way and available on the market is unsatisfactory as an electrode material for ferroelectric capacitors. The reason was that it has too much impurity contents of alkali metals such as Na and K, heavy metals such as Fe and Ni, and radioactive elements such as U and Th.

Attempts have, therefore, been made to refine ruthenium to higher purity. For example, Japanese Patent Application Kokai No. 8-199350 discloses a process for producing a high-purity ruthenium sputtering target. The process comprises dissolving commercially available ruthenium powder in alkali, leaching the solution in water, adding excess NaOH, saturating the mixture with chlorine gas, heating until ruthenium is separated upon evaporation as ruthenium tetroxide, allowing hydrochloric acid and a methanol solution to absorb the tetroxide, refining by repeating the evaporation cycle three times, drying the solution by reflux to solid matter so as to obtain a ruthenium hydroxide precipitate in the form of a gel, drying the precipitate and heating the dry matter in air to obtain ruthenium dioxide powder, further heating the powder in a hydrogen stream until 99.999%-pure ruthenium powder results, hot pressing the powder to a disk, and electron beam-melting the disk to remove Na, K, Ca, and Mg and forming the objective sputtering target.

The above process still has problems; complexity of operation due to many steps involved, susceptibility to contamination during the course of the process, and rather poor yield.

A more recent problem of growing concern is the fact that the steady increase in the density of semiconductor thin film conductor patterns has induced the generation of more and more unwanted particles upon deposition of thin film by sputtering.

[OBJECT OF THE INVENTION]

It is an object of this invention to develop a process for producing high-purity ruthenium having low contents of alkali metals such as Na and K, heavy metals such as Fe and Ni, and radioactive elements such as U and Th and which is suited for applications as a sputtering target material for the deposition of high-purity ruthenium oxide thin film.

Another object of this invention is also to reduce the generation of particles during sputtering.

[SUMMARY OF THE INVENTION]

This inventors have intensively studied for the solution of the above problems. As a result, we have found that the injection of ozone while adding hypochlorous acid converts most of crude ruthenium to ruthenium tetroxide, the use of hydrochloric acid or a mixed solution of hydrochloric acid and ammonium chloride as an absorbent affords RuClO or ammonium ruthenate chloride crystals, and roasting of the crystals in hydrogen or inert gas atmosphere yields high-purity ruthenium powder. It has also been found that a sputtering target of the high-purity ruthenium thus obtained has low contents of metallic impurities that have hitherto posed problems, also low enough gaseous ingredient contents, and hence is capable of controlling the particle generation during sputtering.

On the basis of the above findings, this invention provides:

(A) a process for producing high-purity ruthenium comprising the steps of forming ruthenium tetroxide by blowing ozone-containing gas into crude ruthenium powder while hypochlorous acid or hypochlorite is being added to the powder, allowing a hydrochloric acid solution to absorb the ruthenium tetroxide, evaporating the solution to dryness, and roasting the $RuOCl_3$ crystals thus obtained in a hydrogen atmosphere.

In the above process (A), preferably, concentration of the hydrochloric acid solution ranges from 3 to 12N and the the temperature at which the $RuOCl_3$ crystals are roasted in a hydrogen atmosphere ranges from 300 to 1200° C.

This invention also provides:

(B) a process for producing high-purity ruthenium comprising the steps of forming ruthenium tetroxide by blowing ozone-containing gas into crude ruthenium powder while hypochlorous acid or hypochlorite is being added to the powder, allowing a mixed solution of hydrochloric acid and ammonium chloride to absorb the ruthenium tetroxide, filtering and drying the solution, and roasting the resulting crystals of ammonium chloride ruthenium in an inert atmosphere or hydrogen atmosphere.

In the above process (B), preferably, the concentration of the mixed solution of hydrochloric acid and ammonium chloride ranges from 6 to 12N, the temperature of the mixed solution of hydrochloric acid and ammonium chloride is 25° C. or below and the temperature at which the crystals of ammonium ruthenate chloride are roasted in an inert atmosphere or hydrogen atmosphere ranges from 300 to 1200° C.

This invention further provides:

(C) a high-purity ruthenium material for thin film deposition, characterized in that it contains less than 1 ppm each of alkali metal elements, less than 1 ppm each of alkaline earth metal elements, less than 1 ppm each of transition metal elements, less than 10 ppb each of radioactive elements, a total of less than 500 ppm of carbon and gaseous ingredient elements (oxygen, hydrogen, nitrogen, and chlorine), and that the purity of ruthenium freed from the gaseous ingredient elements is at least 99.995%.

Said ruthenium material, preferably, contains less than 1 ppm each of Al and Si. Said ruthenium material may have a density of 98% or more, an average crystal grain diameter of from 0.1 to 10 $\mu$m and bulk resistance of 6 $\mu\Omega$.cm or less.

Typically, the ruthenium material is a sputtering target.

This invention, in addition, provides:

(D) a semiconductor thin film formed by sputtering a high-purity ruthenium material for thin film deposition described above.

[EXPLANATION OF EMBODIMENTS OF THE INVENTION]

This invention will now be described in detail based on its embodied form.

Crude ruthenium powder for use in this invention is not specially limited but, in general, is a commercially available one with a purity between 98% and about 3N(99.9%). Such crude ruthenium usually contains 10–1000 ppm, in all, of Na, K, Ca, and Mg; 10–1000 ppm of Fe; 1–100 ppm of other transition metal impurities; 10–100 ppm of Al and Si; and 0.5–100 ppb of U and Th.

Hypochlorous acid or hypochlorite to be used in dissolving crude ruthenium is not specially limited either. The hypochlorite may be sodium hypochlorite, potassium hypochlorite, or calcium hypochlorite. They are of low purity for industrial applications. This is because the impurities in hypochlorous acid can be efficiently separated from ruthenium tetroxide subsequently produced.

The amount of hypochlorous acid or hypochlorite to be added desirably ranges from one to five times, more desirably from two to three times, of the equivalent weight of crude ruthenium. If the addition is less than one time the equivalent weight, ruthenium will not completely dissolve. If it exceeds five times the equivalent weight, the liquid volume increases to excess.

The temperature for dissolving ruthenium is 10–100° C., preferably 50–90° C. If it is below 10° C., the dissolving rate is too low whereas a temperature above 100° C. causes vigorous evaporation with undesirable entrainment of the impurities contained in hypochlorous acid.

Although ruthenium dissolves in and reacts with hypochlorous acid or a hypochlorite solution, it is not entirely converted to ruthenium tetroxide ($RuO_4$) gas but partly remains unchanged in the solution.

Where only hypochlorous acid is used, mere 80% or thereabout would be changed to ruthenium tetroxide, depending on the conditions, leaving the remainder in the liquid. Ruthenium thus left in the liquid can all be converted to ruthenium tetroxide by the injection of ozone into the hydrochloric acid solution. The ozone injection into the solution can be done at any time, but it is advisable to time it with the dissolving of ruthenium, since it avoids the formation of ruthenium dioxide due to the decomposition of ruthenium tetroxide in a glass vessel housed in an absorbent equipment and thereby adds to the yield.

The material of the equipment for dissolving ruthenium is preferably glass or the like. Containers of polyvinyl chloride or other organic material are not desirable because they react with the ruthenium tetroxide being produced. It is also advisable that both arrangements for dissolving ruthenium and absorbing the resulting ruthenium tetroxide be designed to be of closed system. Any leakage of ruthenium tetroxide which is noxious would not only be hazardous to human beings but also lead to a decrease in yield. Intrusion of impurities in mist from the dissolving unit and hence the contamination of the absorbent solution with the impurities can be prevented by providing a trap of water, glasswool or the like between the dissolving and absorption units.

As for the solution for the absorption of ruthenium tetroxide, either a hydrochloric acid solution or a mixed solution of hypochlorous acid and mixed solution is used.

When an absorbent solution of hypochlorous acid alone is employed, the hydrochloric acid concentration in the solution desirably ranges from 3 to 12N (Normal). If the concentration is less than 3N, the amount of ruthenium to be absorbed by the solution is insufficient, whereas a concentration of more than 12N makes the solution difficult to handle with too much vaporization of hydrochloric acid.

When a mixed solution of hydrochloric acid and ammonium chloride is used as an absorbent solution, the hydrochloric acid concentration in the solution desirably ranges from 6 to 12N. If the concentration is below 6N, the ruthenium salt precipitation in the solution is inadequate, but if the concentration is above 12N, excessive production of hydrochloric acid vapor involves difficulties in handling. The ammonium chloride to be added together with hydrochloric acid is of high purity, preferably one made by synthesis from high-purity hydrochloric acid and ammonia. The simultaneous addition of hydrochloric acid and ammonium chloride as a mixed solution may be replaced, where necessary, by the absorption in a hydrochloric acid solution followed by the addition of ammonium chloride.

In order to enhance the absorption of ruthenium tetroxide, it is advisable to add a slight amount of an organic solvent to the absorbent solution. Methanol or ethanol in common use is suitable as the organic solvent. Excessive use of the solvent is undesirable because it gives birth to ruthenium dioxide.

The temperature of the absorbent solution is, when the solution consists only of a hydrochloric acid solution, between 0 and 50° C. A temperature outside this range is undesirable since it reduces ruthenium absorption.

For a mixed solution of hydrochloric acid and ammonium chloride used as the absorbent solution, a desirable temperature range is 0–25° C. Temperatures below 0° C. and above 25° C. are objectionable because of too small ruthenium absorption and too much dissolution of the resulting ruthenium salt, respectively.

When a hydrochloric acid solution alone is used as the absorbent solution, the solution after the reaction is evaporated to dryness by a rotary evaporator or the like to form $RuOCl_3$ crystals. Roasting the $RuOCl_3$ crystals in a hydrogen atmosphere yields ruthenium powder. A desirable roasting temperature range is 300–1200° C. At below 300° C., ruthenium powder does not completely result while at above 1200° C. the product is susceptible to contamination from the equipment and renders it impossible to obtain high-purity ruthenium which is not preferable for the object of this invention.

When a mixed solution of hydrochloric acid and ammonium chloride is used as the absorbent solution, ammonium ruthenate chloride precipitates in a crystalline form. The forms of the ammonium ruthenate chloride crystals vary with the conditions for reaction used. For example, the use of a mixed solution of 9N hydrochloric acid and ammonium chloride as the absorbent solution produces a precipitate of $(NH_4)_2RuO_{0.6}Cl_6$ crystals. Absorption in a 9N hydrochloric acid solution followed by the addition of ammonium chloride affords $(NH_4)_2RuOCl_5$ crystals.

After the conclusion of the reaction, the resulting ammonium ruthenate chloride crystals are filtered and dried. Roasting the ammonium ruthenate chloride crystals in an inert atmosphere or hydrogen atmosphere yields ruthenium powder. A desirable roasting temperature is 300–1200° C. Complete ruthenium powder does not form below 300° C., but above 1200° C. contamination from the equipment tends to hamper the formation of high-purity ruthenium.

The finally attained crystal grain size of the ruthenium material for thin-film forming can be controlled by the crystal grain size of the purified ruthenium powder obtained as above and by the sintering conditions as in hot pressing to be described later. The higher the reduction temperature the larger the crystal grain size of the purified ruthenium powder. Experiments showed that the crystal grain size of purified ruthenium powder after two hours' reduction in a hydrogen atmosphere was about 0.035–0.05 $\mu$m when a reduction temperature of 300° C. was used; about 0.3 $\mu$m at a reduction temperature of 500° C.; about 0.8 $\mu$m at 700° C.; and about 1.25 $\mu$m at 1000° C.

The high-purity ruthenium powder thus obtained can be processed, e.g., by hot pressing or other sintering method, to form a desired thin-film forming material such as a sputtering target.

For example, high-purity ruthenium powder obtained in the manner described above is packed into a graphite mold. The charge is then hot pressed at a temperature of 1500–2000° C. and a pressure of 180–350 kg/cm$^2$ for 1–5 hours in a vacuum below $10^{-1}$ mbar. A high-purity ruthenium sputtering target with a density of at least 98% is obtained this way. At a temperature below 1500° C., a density of more than 98% is difficult to attain. A temperature beyond 2000° C., on the other hand, causes a wear and exhaustion problem of the equipment. For these reasons, industrial operation for the manufacture is carried out at a temperature below 2000° C. With regard to thepressure, a higher pressure is beneficial as it increases the density, and usually a pressure above 180 kg/cm$^2$ is desirable. In general, in light of the strength of the molding material, 350 kg/cm$^2$ is the upper limit of the pressure. The time for hot pressing must be at least one hour to attain a sufficient density, but is at most 5 hours, because a longer duration brings little improvement in characteristics.

The final crystal grain size of the product can be controlled by the grain size of the purified ruthenium powder and by control of the sintering conditions. Thus, when the purification process is so controlled as to prepare purified ruthenium powder with an average crystal grain diameter of 5 $\mu$m or less and when the powder is hot pressed below 1800° C., grain growth scarcely occurs during the hot pressing. Eventually, while maintaining the original grain size, a sintered body having an average crystal grain size of 0.1–10 $\mu$m and a bulk resistance value of less than 6 $\mu\Omega$.cm is obtained. A hot pressing temperature in excess of 1800° C. induces grain growth and makes it hardly possible to obtain a fine-grain sintered body. Even sintering at ordinary pressure can yield a high-density sintered body through control of the sintering conditions. In that case, however, a purified ruthenium powder of a smaller grain size than that for hot pressing must be used. Although it depends on the sintering conditions, the crystal grain size of the purified ruthenium powder should be smaller than about 1 $\mu$m.

The high-purity ruthenium material for thin film deposition according to this invention is characterized in that it contains less than 1 ppm each of alkali metal elements such as Na and K, less than 1 ppm each of alkaline earth metal elements such as Ca and Mg, less than 1 ppm each of transition metal elements such as Fe, Ni, Cr, Co, Cu, Mo, Pd, Rh, Os, Ir, and Pt, less than 10 ppb each of radioactive elements such as U and Th, a total of less than 500 ppm of carbon and gaseous ingredient elements (oxygen, hydrogen, nitrogen, and chlorine), and that the purity of ruthenium freed from the gaseous ingredient elements is at least 99.995%.

The alkali metal elements such as Na and K and alkaline earth metal elements are particularly diffusible and migrate easily through a dielectric film, leading to deterioration of MOS-LSI interfacial characteristics. The amounts of those elements to be present should be less than 1 ppm each, preferably less than 0.1 ppm each.

The transition metal elements such as Fe, Ni, Cr, Co, Cu, Mo, Pd, Rh, Os, Ir, and Pt can cause troubles of interfacial joints. To avoid the troubles their proportions should be less than 1 ppm each. In particular, Fe, Ni, Cr, and Co should be less than 0.5 ppm each.

The radioactive elements such as U and Th emit alpha rays which can be responsible for soft errors of semiconductor devices. Their presence must, therefore, be severely restricted to 10 ppb or less, preferably 1 ppb or less, more preferably to 0.5 ppb or less.

The carbon and gaseous ingredient elements (oxygen, hydrogen, nitrogen, and chlorine) tend to cause objectionable particle growth during sputtering. The total amount, therefore, should be less than 500 ppm, preferably less than 100 ppm.

The purity of ruthenium freed from the gaseous ingredient elements is made as high as 99.995% or above, so that the resistivity is reduced to a very low level.

Typical elements Al and Si, which can increase electric resistance, are limited to less than 1 ppm each, preferably than 0.5 ppm each.

[EXAMPLES]

The invention is illustrated by the following examples which are in no way limitative.

(Example 1)

A flask was charged with 580 g of commercially available ruthenium powder (purity, 99.9%), and the ruthenium powder was dissolved by little by little adding of 35 l (liter) of sodium hypochlorite at an effective chlorine concentration of 5%. The solution was heated to 80° C. to produce ruthenium tetroxide. At that time, oxygen gas containing 7 vol % ozone was simultaneously injected into the solution. As an absorbent solution, 7 l of a solution at a hydrochloric acid concentration of 6N and containing 10 vol % ethanol at 25° C. was prepared. About 18 hours later, all the ruthenium was absorbed in the absorbent solution as ruthenium tetroxide. The solution was then evaporated to dryness, when 1360 g of $ROCl_3$ crystals resulted. The crystals were roasted in a hydrogen atmosphere at 680° C., and about 570 g of high-purity ruthenium powder was obtained. The yield was 98%. The average crystal grain size of the purified ruthenium powder was about 0.8 μm. This purified ruthenium powder was designated purified powder A.

The purified ruthenium powder A so obtained was molded to a desired shape and hot pressed at a temperature of 1800° C. and a pressure of 300 kg/cm$^2$ for 2 hours. A disk-shaped ruthenium sputtering target 110 mm in diameter and 5 mm thick was thus obtained.

(Example 2)

Purified ruthenium powder was made by the same procedure as that of Example 1.

The purified ruthenium powder (purified powder A) was molded to a desired shape and hot pressed at 1950° C. and 300 kg/cm$^2$ for 2 hours. A disk-shaped ruthenium sputtering target 110 mm in diameter and 5 mm thick was obtained.

(Example 3)

580 g of commercially available ruthenium powder (purity, 99.9%) was placed into a flask and was dissolved by gradual addition of 35 l of sodium hypochlorite at an effective chlorine concentration of 5%. The solution was heated to 80° C. to produce ruthenium tetroxide. At the same time, oxygen gas containing 7 vol % ozone was injected into the solution. As g an absorbent solution, 7 l of a mixed solution of 9N hydrochloric acid, 350 g ammonium chloride, and 5 vol % ethanol was prepared. The temperature of the absorbent solution was 25° C. About 18 hours later, ruthenium was completely absorbed in the absorbent solution as ruthenium tetroxide, and ammonium ruthenate chloride crystals precipitated. The ammonium ruthenate chloride thus formed weighed about 2040 g. The crystals were roasted in an argon atmosphere at 500° C., and about 570 g of high-purity ruthenium powder was obtained. The yield was 98%. The average crystal grain size of the purified ruthenium powder was about 0.5 μm. This purified ruthenium powder was designated purified powder B.

The purified ruthenium powder B so obtained was molded to a desired shape and hot-pressed at 1650° C. and 300 kg/cm$^2$ for 2 hours. A disk-shaped ruthenium sputtering target 110 mm in diameter and 5 mm thick was obtained.

(Comparative Example 1)

1000 g of crude ruthenium was dissolved in alkali and was leached in water, excess sodium hydroxide was added, chlorine gas was allowed to saturate, and by the application of heat ruthenium tetroxide was separated by evaporation. As an absorbent solution, 10 l of a solution of 6N hydrochloric acid and 10 vol % ethanol at 25 C. was prepared. The solution was allowed to absorb the ruthenium tetroxide, and distillation was repeated for a total of three times for purification. The solution was dried by a rotary evaporator for 24 hours. The resulting crystals were dried and heated in air to obtain ruthenium dioxide. It was further heated in a hydrogen stream at 680° C. to obtain ruthenium powder. The yield was 50–60%. The average crystal grain size of the purified ruthenium powder was about 0.8 μm. This purified ruthenium powder was designated purified powder C.

The purified ruthenium powder C so obtained was molded to a desired shape and hot pressed at 1800° C. and 300 kg/cm$^2$ for 2 hours to obtain a disk-shaped ruthenium sputtering target 110 mm in diameter and 5 mm thick.

(Comparative Example 2)

Purified ruthenium powder was produced in the same way as in Comparative Example 1.

The purified ruthenium powder obtained (purified powder C) was molded to a desired shape and hot pressed at 1450° C. and 300 kg/cm$^2$ for 2 hours. A disk-shaped ruthenium sputtering target 110 mm in diameter and 5 mm thick was obtained.

(Comparative Example 3)

Crude ruthenium powder was not purified by the wet process but was directly subjected to electron-beam melting. A disk thus obtained was machined to a disk-shaped ruthenium sputtering target 110 mm in diameter and 5 mm thick.

Each of the ruthenium sputtering targets obtained as above was joined to a copper backing plate by In—Sn alloy soldering. With each target reactive sputtering was carried out using a magnetron sputtering system in an oxygen atmosphere to deposit a thin ruthenium oxide film onto a 3-inch wafer.

(Results)

The impurity contents in the starting ruthenium powder and in the sputtering targets are shown in Table 1.

TABLE 1

| | Starting Ru powder | Ex. 1 | Ex. 2 | Ex. 3 | unit: ppm (U, Th : ppb) Comp. 1 | Comp. 2 | Comp. 3 |
|---|---|---|---|---|---|---|---|
| Na | 20 | 0.5 | 0.5 | <0.1 | 1.2 | 5 | <0.1 |
| K | 20 | <0.1 | <0.1 | <0.1 | 0.3 | 0.2 | <0.1 |
| Ca | 30 | 0.7 | <0.1 | <0.1 | 1.5 | 5 | <0.1 |
| Mg | 10 | <0.1 | <0.1 | <0.1 | <0.1 | 0.5 | <0.1 |
| Fe | 50 | 0.4 | 0.4 | 0.2 | 3 | 1.5 | <0.1 |
| Ni | 2 | <0.1 | <0.1 | <0.1 | 0.8 | 0.8 | <0.1 |
| Cr | 1 | <0.1 | <0.1 | <0.1 | <0.1 | <0.1 | <0.1 |
| Co | 1 | <0.1 | <0.1 | <0.1 | <0.1 | <0.1 | <0.1 |
| Cu | 1 | <0.1 | <0.1 | <0.1 | <0.1 | <0.1 | <0.1 |
| Al | 30 | <0.1 | <0.1 | <0.1 | 5 | 5 | <0.1 |
| Si | 24 | 0.5 | 0.5 | 0.3 | 10 | 10 | 0.5 |
| Mo | 10 | <1 | <1 | <1 | <1 | <1 | 10 |
| Pd | 20 | <1 | <1 | <1 | <1 | <1 | 20 |
| Rh | 20 | <1 | <1 | <1 | <1 | <1 | 20 |
| Os | 10 | <1 | <1 | <1 | <1 | <1 | 10 |
| Ir | 10 | <1 | <1 | <1 | <1 | <1 | 10 |
| Pt | 10 | <1 | <1 | <1 | <1 | <1 | 10 |
| U | 25 | <0.1 | <0.1 | <0.1 | 0.5 | 0.5 | 25 |
| Th | 20 | <0.2 | <0.2 | <0.2 | 2 | 2 | 20 |
| C | 100 | <10 | <10 | <10 | 20 | 20 | <10 |
| O | 500 | 20 | 20 | 20 | 100 | 100 | 50 |
| H | 10 | <1 | <1 | <1 | <1 | <1 | <1 |
| N | 50 | <10 | <10 | <10 | <10 | <10 | <10 |
| Cl | 50 | <10 | <10 | <10 | <10 | <10 | <10 |
| Ru | 99.9 | 99.999 | 99.999 | 99.999 | 99.997 | 99.996 | 99.992 |

Ru purity is a value freed from the gaseous ingredient contents, in %.

The hot pressing conditions, target densities, average crystal grain sizes, bulk resistance values, numbers of objectionable particles on the thin film-deposited wafers, and electrode characteristics of the thin films so deposited are given in Table 2.

TABLE 2

| Item | Ex. 1 | Ex. 2 | Ex. 3 | Comp. 1 | Comp. 2 | Comp. 3 |
|---|---|---|---|---|---|---|
| Purified powder | A | A | B | C | C | Direct EB melting |
| Av. particle dia. of powder | 0.8 μm | 0.8 μm | 0.5 μm | 0.8 μm | 0.8 μm | — |
| HP temp. | 1800° C. | 1950° C. | 1650° C. | 1800° C. | 1450° C. | — |
| HP pressure | 300 kg/cm² | 300 kg/cm² | 300 kg/cm² | 300 kg/cm² | 300 kg/cm² | — |
| HP time | 2 hrs | 2 hrs | 2 hrs | 2 hrs | 2 hrs | — |
| Density | 99.40% | 99.60% | 98.40% | 99.40% | 93.80% | 99.50% |
| Av. particle dia. | 1.0 μm | 6.0 μm | 0.5 μm | 1.0 μm | 0.8 μm | 1.0 μm |
| Electric resisty | 5.8 μΩ·cm | 5.9 μΩ·cm | 6.0 μΩ·cm | 6.5 μΩ·cm | 6.2 μΩ·cm | 7.6 μΩ·cm |
| No. of part. in film | 15 part./wafer | 10 part./wafer | 20 part./wafer | 40 part./wafer | 50 part./wafer | 20 part./wafer |
| Electrode characteristic | good | good | good | much leakage current | much leakage current | much leakage current |

The ruthenium sputtering targets made by the process of the invention for producing high-purity ruthenium were of very high purity. They had extremely small contents of impurities, i.e., not only alkali metals, alkaline earth metals, heavy metals, and radioactive elements but also light metal elements, platinum group elements, carbon, and gaseous ingredient elements. The thin films deposited using the high-purity ruthenium sputtering targets according to this invention exhibited good electrode characteristics and created only small amounts of objectionable particles.

On the other hand, the sputtering targets made from the conventionally produced ruthenium powder (purified powder C) contained much impurities due to the long duration of the purifying process. The thin films formed using the sputtering targets showed much leakage current.

The sputtering targets made from the powder by direct electron-beam melting rather than by wet purification were freed from alkali metal elements, alkaline earth metal elements, carbon, and gaseous ingredient elements. However, transition metal elements and radioactive elements could not be removed from the material. Hence the thin films deposited using those targets had high electric resistance values and showed much leakage current. Those defects made them unusable as semiconductor thin films.

[ADVANTAGES OF THE INVENTION]

This invention renders it possible to produce a high-purity ruthenium powder whose contents of alkali metals, carbon and gaseous ingredient elements, transition metal elements, and radioactive elements have been satisfactorily reduced. This invention thereby permits the manufacture of high-purity ruthenium materials for thin film deposition with reduced impurity contents. The high-purity ruthenium materials for thin film deposition according to this invention have low resistivity, produce only small amounts of objectionable particles during sputtering, and form thin films with good electrode characteristics. The materials are suitably used for the deposition of semiconductor thin films such as of dielectric capacitors.

We claim:

1. A process for producing high-purity ruthenium comprising the steps of:
   forming ruthenium tetroxide by blowing ozone-containing gas into crude ruthenium powder while hypochlorous acid or hypochlorite is being added to the powder,
   allowing a hydrochloric acid solution to absorb the ruthenium tetroxide,
   evaporating the solution to dryness, to form $RuOCl_3$ crystals and
   roasting the $RuOCl_3$ crystals in a hydrogen atmosphere.

2. A process according to claim 1 wherein the concentration of the hydrochloric acid solution is in the range of from 3 to 12N.

3. A process according to claim 1 wherein the temperature at which the $RuOCl_3$ crystals are roasted in the hydrogen atmosphere is in the range of from 300 to 1200° C.

4. A process according to claim 2 wherein the temperature at which the $RuOCl_3$ crystals are roasted in the hydrogen atmosphere is in the range of from 300 to 1200° C.

5. A process for producing high-purity ruthenium comprising the steps of:
   forming ruthenium tetroxide by blowing ozone-containing gas into crude ruthenium powder while hypochlorous acid or hypochlorite is added to the powder,
   allowing a mixed solution of hydrochloric acid and ammonium chloride to absorb the ruthenium tetroxide,
   filtering and drying the solution, to form crystals of ammonium chloride ruthenium and
   roasting the resulting crystals in an inert atmosphere or hydrogen atmosphere.

6. A process according to claim 5 wherein the concentration of the mixed solution of hydrochloric acid and ammonium chloride is in the range of from 6 to 12N.

7. A process according to claim 5 wherein the temperature of the mixed solution of hydrochloric acid and ammonium chloride is 25° C. or below.

8. A process according to claim 6 wherein the temperature of the mixed solution of hydrochloric acid and ammonium chloride is 25° C. or below.

9. A process according to claim 5 wherein the temperature at which the crystals of ammonium ruthenate chloride are roasted in an inert atmosphere or hydrogen atmosphere is in the range of from 300 to 1200° C.

10. A process according to claim 6 wherein the temperature at which the crystals of ammonium ruthenate chloride are roasted in an inert atmosphere or hydrogen atmosphere is in the range of from 300 to 1200° C.

11. A process according to claim 7 wherein the temperature at which the crystals of ammonium ruthenate chloride are roasted in an inert atmosphere or hydrogen atmosphere is in the range of from 300 to 1200° C.

12. A process according to claim 8 wherein the temperature at which the crystals of ammonium ruthenate chloride are roasted in an inert atmosphere or hydrogen atmosphere is in the range of from 300 to 1200° C.

\* \* \* \* \*